United States Patent [19]

Visuri

[11] Patent Number: 5,160,900
[45] Date of Patent: Nov. 3, 1992

[54] METHOD TO SPEED UP THE TRAINING OF A SHIFT OSCILLATOR IN A FREQUENCY SYNTHESIZER

[75] Inventor: Pauli Visuri, Paimio, Finland
[73] Assignee: Nokia Mobile Phones Ltd., Salo, Finland
[21] Appl. No.: 824,812
[22] Filed: Jan. 21, 1992
[51] Int. Cl.$^5$ .......................... H03L 7/10; H03L 7/18
[52] U.S. Cl. ........................................ 331/18; 331/14; 331/25; 375/120; 455/76; 455/260
[58] Field of Search ..................... 331/1 A, 18, 25, 14; 375/120; 455/76, 260

[56] References Cited
U.S. PATENT DOCUMENTS

| | | | |
|---|---|---|---|
| 4,107,612 | 8/1978 | Levegue | 331/25 X |
| 4,893,094 | 1/1990 | Herold et al. | 331/1 A |
| 5,036,216 | 7/1991 | Hohmann et al. | 331/25 X |

Primary Examiner—Siegfried H. Grimm
Attorney, Agent, or Firm—Perman & Green

[57] ABSTRACT

A method to speed up the training of the output frequency signal (Out) of a frequency synthesizer circuit. The circuit comprises a voltage controlled oscillator (7) controlled by a filtered (6) feedback signal (Fb) output by a phase detector circuit (5) having a first input signal (Rs), which is produced by a reference counter (3) dividing an external reference signal produced by a reference oscillator (2), and a second input signal (Cs) produced by a programmable counter (4) dividing an output signal (Vs) from the voltage controlled oscillator (7). When the training process is started, the internal reference frequency of the first and second input signals (Rs, Cs) is simultaneously increased by a predetermined amount for a predetermined time.

10 Claims, 1 Drawing Sheet

METHOD TO SPEED UP THE TRAINING OF A SHIFT OSCILLATOR IN A FREQUENCY SYNTHESIZER

BACKGROUND OF THE INVENTION

The present invention relates to a method to speed up the training of the output frequency signal (Out) of a frequency synthesizer circuit. The invention also relates to a shift oscillator in a radiotelephone utilizing the inventive method.

It is known to use a shift oscillator in a radiotelephone to generate a suitable shift frequency (e.g. 90 MHz) signal which is mixed with the local oscillator frequency (e.g. 945 MHz) signal of the receiver in order to generate a transmitter frequency (e.g. 855 MHz) signal. The relatively low frequency payload signal to be transmitted is mixed with the shift frequency signal.

The shift oscillator must meet conflicting requirements. On one hand it should be able to rapidly produce the predetermined fixed frequency output signal so that the radiotelephone rapidly is ready for transmission after start-up, for instance. On the other hand the frequency synthesizer of the shift oscillator should include a relatively slow phase locked loop in order to provide a good modulation response at low frequencies of the payload signal.

In prior art shift oscillators different approaches are used to meet these requirements. If the conflicting requirements are not too stringent, then it is possible to design a compromise. In order to meet more stringent requirements it is necessary to devise e.g. extra switching means which direct a "start-up signal" to the voltage controlled oscillator in order to shorten the training time, i.e. the time which the oscillator needs to reach a stable state. To realize a switchable start-up mode also other methods are conceivable,,which switch some control signals directed to the shift oscillator.

OBJECTS OF THE INVENTION

The object of the present invention is to provide a method to speed up the training of the output frequency signal of a frequency synthesizer circuit without resorting to any auxiliary switching means.

SUMMARY OF THE INVENTION

The above object is achieved with the inventive method according to claim 1, the frequency synthesizer circuit comprising a voltage controlled oscillator controlled by a filtered feedback signal output by a phase detector circuit having a first input signal (Rs), which is produced by a reference counter dividing an external reference signal produced by a reference oscillator, and a second input signal produced by a counter dividing an output signal from the voltage controlled oscillator, characterized in that when the training process is started the internal reference frequency of the first and second input signals is simultaneously increased by a predetermined amount for a predetermined time. Other objects and favorable solutions according to the invention will be presented in the following description and in the enclosed claims.

The present invention also provides a shift oscillator circuit in a radiotelephone utilizing the inventive method.

Basically the internal reference frequency of the shift oscillator is increased during the training period so that the oscillator will rapidly reach a stable state, there being no need to change the favorable slow speed of the phase locked loop. As a result the start-up time for the transmitter is considerably reduced.

BRIEF DESCRIPTION OF THE DRAWING

The FIGURE of the drawing shows schematically a block diagram of a frequency synthesizer circuit operating according to the inventive method.

DETAILED DESCRIPTION OF THE PREFERRED EMBODIMENT

Figure 1:
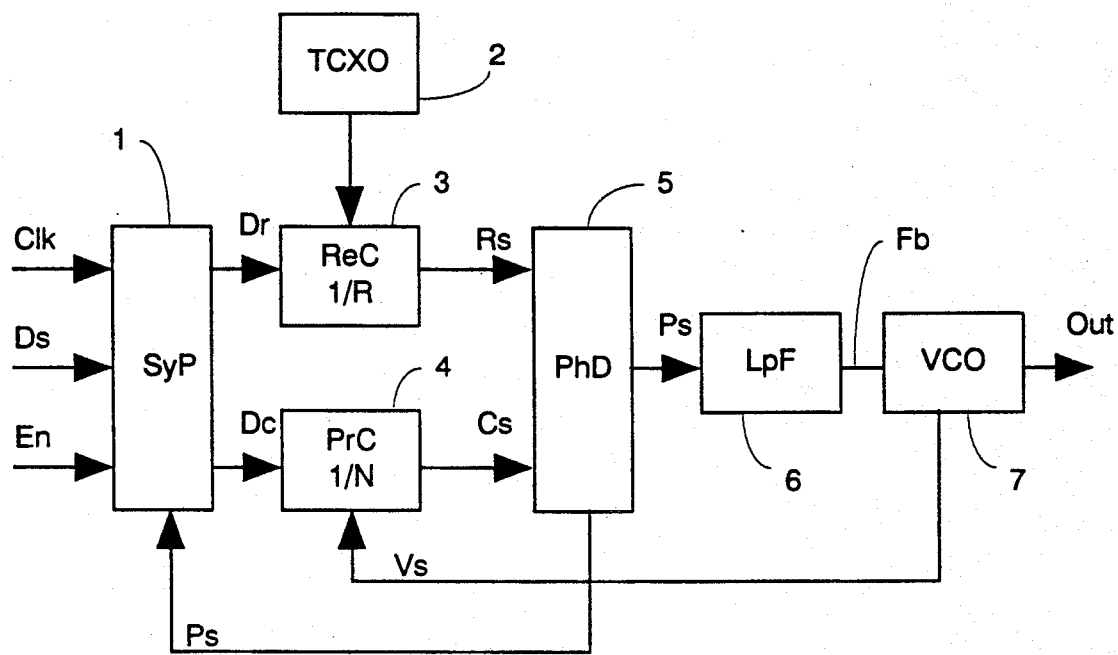

Referring to the FIGURE there is shown a block diagram of a frequency synthesizer circuit being part of a radio telephone and operating according to the inventive method. The circuit comprises a voltage controlled oscillator (VCO) 7 controlled by a feedback signal Fb. A phase detector circuit (PhD) 5 generates a phase indication signal Ps, which is filtered in a low pass filter (LpF) 6 and then connected to the VCO as the feedback signal Fb. The phase detector has two inputs receiving signals to be compared. A first input signal Rs is produced by a reference counter 3 (ReC) dividing an external reference signal generated by a temperature controlled crystal reference oscillator 2 (TCXO). A second input signal Cs is generated by a programmable counter 4 (PrC) dividing an output signal Vs from the VCO 7.

The counters 3 and 4 are programmable counters which divide the input signals from the TCXO and the VCO with a number R and N respectively, which are controlled by the synchronous programming circuit 1 (SyP). The division may also be considered as a multiplication with the inverse numbers, i.e. with the factors 1/R and 1/N, respectively. The programming circuit SyP controls the counters ReC and PrC with data signals Dr and Dc, respectively, in accordance with controlling signals Clk (clock), Ds (serial data) and En (enable) generated in a microprocessor (not shown) controlling the operation of the radiotelephone.

This far the above description could apply to a conventional frequency synthesizer circuit being part of a shift oscillator. The normal operation is briefly described, although this is prior art well known to a person skilled in the art. The frequency of the output signal Out is predefined, and in this example a fixed frequency of 90 MHz is desired. In normal operation the frequency of the internal reference signals Rs, Cs is of the order 10–30 kHz, e.g. 25 kHz. The PhD-circuit then produces output pulses as a signal Ps with that frequency, the pulse width indicating the phase difference between the input signals Rs and Cs. The pulses Ps are low-pass filtered in the filter LpF, with a cut off frequency of e.g. 10 Hz, so that the feedback signal Fb connected to the input of the VCO is virtually a dc voltage. The factors 1/R and 1/N are selected to produce comparable signals Rs, Cs from the oscillator signals. The factors are selected depending on the selected output frequency (Out) and the desired internal reference frequency. During start-up of the transmitter there is usually a considerable difference between the actual output signal Out and the desired output signal with the fixed frequency of 90 MHz. Without any further measures the training of the phase locked loop will take a considerable time, due to the slow response of the loop.

Now according to the invention the internal reference frequency of the first and second input signals Rs and Cs is simultaneously increased by a predetermined amount when the training process is started. In practical tests an increase to a frequency 8 times the normal (e.g. to 200 kHz) has provided good results, but in principle there are no restrictions on the amount of the increase, so that the ratio between the higher frequency and the normal internal reference frequency can have any suitable value greater than 1.

The internal reference frequency is increased for a predetermined time, which is selected according to the operating characteristics of the shift oscillator. In practice a training time of c. 200 ms with increased frequency is considered suitable for the above mentioned values, i.e. normal frequency 25 kHz and an increased frequency 200 kHz for c. 200 ms. The increased internal reference frequency provides a faster response of the feedback loop, i.e. a change of the cut-off frequency of the feedback loop.

The frequency increase is controlled by reducing the factors 1/R, 1/N of the counters 3, 4. The synchronous programming circuit 1 generates data control signals Dr, Dc to said counters 3, 4 at a selected moment. The circuit SyP receives from the microprocessor (not shown) a clock signal Clk clocking in serial data Ds to a register in the SyP. When the programming data Ds is completely received in the SyP, the microprocessor activates the enable signal En. SyP is now ready to output new factors as data signals Ds, Dc to the counters ReC and PrC, respectively. The exact moment when the signals Ds, Dc are activated is controlled by the control signal Ps enabling a synchronous and simultaneous change of the outputs of the synchronous programming circuit SyP. The signal Ps is activated when the phase of the phase detector PhD is zero.

The increased internal reference frequency also affects the modulation response, but only during the training time. After that the normal reference frequency is again selected by changing the values of the corresponding control signals Dr, Dc. This guarantees then a good modulation response for low payload signal frequencies.

It has to be noted that the inventive method requires no extra or auxiliary switching means in order to provide the increased internal reference frequency. The method is realized as a program in the controlling microprocessor (not shown), the program triggering the control signal En and providing suitable data signals Ds.

I claim:

1. Method to speed up the training of the output frequency signal (Out) of a frequency synthesizer circuit comprising a voltage controlled oscillator (7) controlled by a filtered (6) feedback signal (Fb) output by a phase detector circuit (5) having a first input signal (Rs), which is produced by a reference counter (3) dividing an external reference signal produced by a reference oscillator (2), and a second input signal (Cs) produced by a programmable counter (4) dividing an output signal (Vs) from the voltage controlled oscillator (7), characterized in that when the training process is started the internal reference frequency of the first and second input signals (Rs, Cs) is simultaneously increased by a predetermined amount for a predetermined time.

2. Method according to claim 1, characterized in that said frequency increase is controlled by reducing the factors (1/R, 1/N) of the counters (3, 4).

3. Method according to claim 2, characterized in that the change of the factors is controlled by a synchronous programming circuit (1) producing as outputs data control signals (Dr, Dc) to said counters (3, 4).

4. Method according to claim 3, characterized in that the exact moment of said frequency increase is determined by a control signal (Ps) produced by the phase detector circuit (5) enabling the change of the outputs of the synchronous programming circuit (1).

5. Method according to claim 4, characterized in that said exact moment is selected as the moment when the phase of the phase detector (5) is zero.

6. A control circuit for increasing the speed of training of a radiotelephone shift oscillator, the combination comprising:
a reference counter;
a programmable counter;
phase detector means connected to said reference and programmable counters to provide a signal indicative of a phase difference between signals generated by said counters;
variable shift oscillator means responsive to an output from said phase detector means for producing an output frequency signal and for producing a feedback signal to said programmable counter to control the operation of said programmable counter; and
programming means for controlling the frequency of operation of said reference and programmable counters, said programming means including means for increasing the frequency of operation of both said reference and programmable counter upon the commencement of training of said variable shift oscillator means.

7. The control circuit as recited in claim 6 wherein each said reference counter and programmable counter includes division means for controlling the output frequency of each said counter, said programming means controlling said division means to accomplish said increased frequency operation of said reference and programmable counters.

8. The control circuit as recited in claim 7 wherein said phase detector means produces a control signal that is fed to said programming means to cause said programming means to enable said increase in the frequency of operation of said reference and programmable counters.

9. The control circuit as recited in claim 8 wherein said control signal from said phase detector means is generated when the inputs to said phase detector means indicate a zero phase difference.

10. A control circuit as recited in claim 6 further comprising a microprocessor for controlling the operation of said radiotelephone, said microprocessor providing input signals to said programming means to cause the generation of signals that affect a change in output frequencies from said reference and programmable counters.

* * * * *